(12) United States Patent
Bandic et al.

(10) Patent No.: US 9,928,907 B1
(45) Date of Patent: Mar. 27, 2018

(54) BLOCK ERASE SCHEMES FOR CROSS-POINT NON-VOLATILE MEMORY DEVICES

(71) Applicant: Western Digital Technologies, Inc., Irvine, CA (US)

(72) Inventors: Zvonimir Z. Bandic, San Jose, CA (US); Won Ho Choi, San Jose, CA (US); Jay Kumar, Saratoga, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/418,178

(22) Filed: Jan. 27, 2017

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0038* (2013.01); *G11C 13/0097* (2013.01)

(58) Field of Classification Search
CPC ............ G11C 13/0026; G11C 13/0028; G11C 13/0069; G11C 8/12; G11C 2013/0083; G11C 2213/71; G11C 2213/32; G11C 2213/35; G11C 11/22; G11C 13/0009; G11C 13/004; G11C 2013/0078; G11C 2213/77; G11C 5/02; G11C 5/025; G11C 7/18
USPC ....... 365/51, 145, 158, 148, 185.18, 230.03, 365/171, 185.24, 189.05, 191, 200, 55, 365/56, 63; 257/324, 329; 345/84, 691, 345/98
See application file for complete search history.

(56) References Cited

U.S. PATENT DOCUMENTS

| | | | |
|---|---|---|---|
| 7,755,935 B2 | 7/2010 | Lam et al. |
| 8,909,493 B2 | 12/2014 | Avila et al. |
| 9,082,493 B2 | 7/2015 | He et al. |
| 9,312,005 B2 | 4/2016 | Castro |
| 9,349,450 B2 | 5/2016 | Otsuka et al. |
| 9,418,738 B2 | 8/2016 | Castro |
| 2010/0161888 A1 | 6/2010 | Eggleston |

(Continued)

OTHER PUBLICATIONS

Liang et al., "An Ultra-Low Reset Current Cross-Point Phase Change Memory with Carbon Nanotube Electrodes", IEEE Transactions on Electron Devices, vol. 59, No. 4, pp. 1155-1163, Apr. 2012; Citing Abstract Only.

(Continued)

*Primary Examiner* — Thong Q Le
(74) *Attorney, Agent, or Firm* — Foley & Lardner LLP (57) ABSTRACT

A storage device includes a cross-point non-volatile memory (NVM) device that includes a first subset of cells. Cells of the first subset of cells may share either a bitline or a wordline. There may be at least one buffer cell on a respective bitline or wordline between each adjacent pair of cells from the first subset of cells. The storage device includes a control module. The control module is configured to receive a set of I/O operations. The control module is configured to execute a first subset of the set of I/O operations in parallel across the first subset of cells of the cross-point memory component. The control module may execute the first subset of the set of I/O operations such that I/O operations are not executed at the respective buffer cells.

20 Claims, 5 Drawing Sheets

(56) References Cited

U.S. PATENT DOCUMENTS

2010/0284213 A1 11/2010 Savransky
2016/0141337 A1* 5/2016 Shimabukuro ..... H01L 27/2481
                                                              365/51

OTHER PUBLICATIONS

Yoshioka et al., "High Density NAND Phase Change Memory with Block-Erase Architecture to Compromise Write and Disturb Requirements" 2012 IEEE, 4 pgs. Applicant points out, in accordance with MPEP 609.04(a), that the year of publication, 2012, is sufficiently earlier than the effective U.S. filing date, Jan. 27, 2017, so that the particular month of publication is not in issue.
Xu et al., "Overcoming the Challenges of Crossbar Resistive Memory Architectures", Retrieved on Aug. 31, 2016 from https://www.cs.utah.edu/~rajeev/pubs/hpcal5.pdf, 13 pgs.

* cited by examiner

FIG. 5

BLOCK ERASE SCHEMES FOR CROSS-POINT NON-VOLATILE MEMORY DEVICES

TECHNICAL FIELD

The disclosure generally relates to solid state storage devices, and more particularly, to cross-point non-volatile memory storage devices.

BACKGROUND

Solid State Devices (SSDs) may utilize non-volatile memory (NVM) devices, such as flash memory, phase change memory (PCM), resistive random access memory (ReRAM), magneto-resistive random access memory (MRAM), programmable metalization cell (PMC, otherwise known as conductive-bridging random access memory, or CBRAM®), or the like. Some of these devices, such as PCM and ReRAM, utilize forms of cross-point memory architecture. Cross-point memory architecture can include the use of memristors. Memristor technology may store data based on the electrical resistance of respective memristors. Memristors may change between a high-resistance state and a low-resistance state based on an amount and direction of electrical current to which the memristor was most recently exposed. Write operations to devices with cross-point memory architecture may include setting or altering the electrical resistance state of the respective components that hold such resistance states.

SUMMARY

In some examples, a storage device includes a cross-point non-volatile memory (NVM) device that includes a first subset of cells. Cells of the first subset of cells may share either a bitline or a wordline. There may be at least one buffer cell on a respective bitline or wordline between each adjacent pair of cells from the first subset of cells. The storage device includes a control module. The control module is configured to receive a set of I/O operations. The control module is configured to execute a first subset of the set of I/O operations in parallel across the first subset of cells of the cross-point memory component. The control module may execute the first subset of I/O operations such that I/O operations are not executed at the respective buffer cells.

In some examples, a method includes managing read or write operations to a cross-point non-volatile memory (NVM) device. The method may include receiving a set of read or write operations for the cross-point NVM device. The NVM device may include a plurality of cells grouped into a plurality of sets of cells. For each sets of cells, cells of the respective set of cells share a bitline or a wordline of the cross-point NVM device. The method may further include executing a first subset of the set of I/O operations in parallel across a set of cells of the plurality of sets of cells. For adjacent pairs of cells from the set of cells there is at least one respective buffer cell that is both not undergoing a read or write operation of the subset of read or write operations and is between the respective cells of the adjacent pair of cells.

In some examples, a system may include means for receiving a set of I/O operations for a cross-point non-volatile memory (NVM) device. The system may further include means for executing a first subset of the set of I/O operations in parallel across a first subset of cells of the cross-point NVM device. Cells of the first subset of cells share a bitline or a wordline. For each adjacent pair of cells from the first subset of cells, there is at least one respective buffer cell that is both not undergoing an I/O operation of the first subset of I/O operations and is between the respective cells of the adjacent pair of cells.

The details of one or more examples are set forth in the accompanying drawings and the description below. Other features, objects, and advantages will be apparent from the description and drawings, and from the claims.

DETAILED DESCRIPTION

In general, this disclosure describes details techniques for managing the parallel execution of I/O operations at a localized area of a non-volatile memory (NVM) device, such as in a solid-state drive (SSD). For example, a NVM device may include phase change memory (PCM) or resistive random access memory (ReRAM). The NVM device may employ cross-point memory architecture. The NVM device may be divided into a plurality of tiles that each include a plurality of memory cells, such that a power supply is configured to provide electrical pulses that may execute I/O operations to each tile in parallel (e.g., with simultaneous writes). The NVM device may receive a plurality of I/O operations. The memory device may execute the plurality of I/O operations at cells of a tile. The NVM device may execute a subset of the plurality of I/O operations at a subset of cells of the tile. Cells of the subset of cells may share at least a bitline or wordline. Cells of the subset of cells may have at least one "buffer" cell between each respective cell of the subset and other cells of the subset of cells.

An I/O operation may be a write operation or a read operation, for example. A write operation may include either a RESET operation or a SET operation. A RESET operation may change an electrical resistance state of a memristor of a memory cell undergoing the I/O operation. The RESET operation may change the electrical resistance of the memory cell from a relatively-low resistance state to a relatively high-resistance state. Similarly, a SET operation may change the electrical resistance state of a memristor of a memory cell from a relatively high resistance state to a relatively low resistance state.

In certain examples, a RESET operation may be referred to as a "program" operation, and a SET operation may be referred to as a "erase" operation. However, in other examples, RESET and SET operations may be used interchangeably to mean the opposite. For example, in some instances an erase operation may be referred to as a RESET operation, and a program operation may be referred to as a SET operation. However, for purposes of clarity, erase operations as described herein are referred to as SET operations, and program operations as described to herein are referred to as RESET operations.

In some examples, a NVM device may determine that a plurality of I/O operations is to be executed at cells of a tile of a memory array, such that at least a portion of cells that will be written/erased by the I/O operations are adjacent cells within the tile. While, in some examples, a NVM device may execute the plurality of I/O operations in a bit-by-bit technique (e.g., individually programming/erasing one cell at a time by running a designated program or erase current through the one cell) to avoid thermal interference between cells, such a technique may result in relatively slow write throughput. Aspects of this disclosure relate to a NVM device executing a first subset of the plurality of I/O operations to a first subset of cells of the tile in parallel (e.g., substantially simultaneously as part of a single, combined write operation). Put differently, aspects of this disclosure relate to a NVM device writing to a plurality of cells at one or more tiles as part of a single operation such that a power supply of the storage device generates and delivers electrical pulses for the plurality of cells in a single (e.g., not substantially staggered) operation. A NVM device may execute the first subset of I/O operations to the first subset of cells such that buffer cells are between cells of the subset of cells. A buffer cell may be a cell of the tile that is not undergoing an I/O operation of the subset of I/O operations. Buffer cells may provide physical space between cells that are undergoing I/O operations to reduce the impact of interference (e.g., thermal interference).

In some examples, a NVM device may execute the first subset of I/O operations to the first subset of cells such that buffer bitlines are between cells of the subset of cells that are in different bitlines. A buffer bitline may be a bitline of the tile in which no cells are being programmed/erased (e.g., a bitline that includes nothing but buffer cells) during the execution of the subset of I/O operations. Put differently, in some examples, no cells of the first subset of cells occupy adjacent bitlines. In other examples, a NVM device may instead or also use buffer wordlines. A buffer wordline may be a wordline of the tile in which no cells are being programmed/erased (e.g., a wordline that includes nothing but buffer cells) during the execution of the subset of I/O operations. However, for purposes of clarity, buffer bitlines are predominantly used herein.

The NVM device may continue executing the plurality of I/O operations by executing, in parallel, a second subset of I/O operations at a second subset of cells. Similar to the first subset of cells, buffer bitlines may be between cells of the second subset of cells that are in different bitlines. The second subset of cells may have the same number of cells as the first number of cells. The NVM device may continue to execute the plurality of I/O operations using subsets of I/O operations at subsets of cells of the tile as described herein until the I/O operations to be performed at the tile are completed.

In some examples, the plurality of I/O operations may relate to cells that are within more than one tile. For example, NVM device may determine that a plurality of I/O operations is to be written to cells that occupy two tiles. In such examples, NVM device may execute, in parallel, a first subset of I/O operations at a first subset of cells in the first tile and a second subset of I/O operations at a second subset of cells in the second tile as described above. NVM device may identify the first subset of cells and the second subset of cells such that one or more buffer bitlines are between cells of the first subset of cells and cells of the second subset of cells. After the first and second subsets of I/O operations are executed, the NVM device may execute a third and fourth subset of I/O operations at a third and fourth subset of cells of the first tile and second tile, respectively. In this way, the NVM device may increase write throughput by executing I/O operations in parallel to a tile of cells. Further, by including buffer cells between cells of a subset of cells that are undergoing a subset of the I/O operations, the NVM device may reduce interference (e.g., noise/thermal interference) between the cells of the subset of cells (and other adjacent cells) to reduce I/O operation errors.

Figure 1:
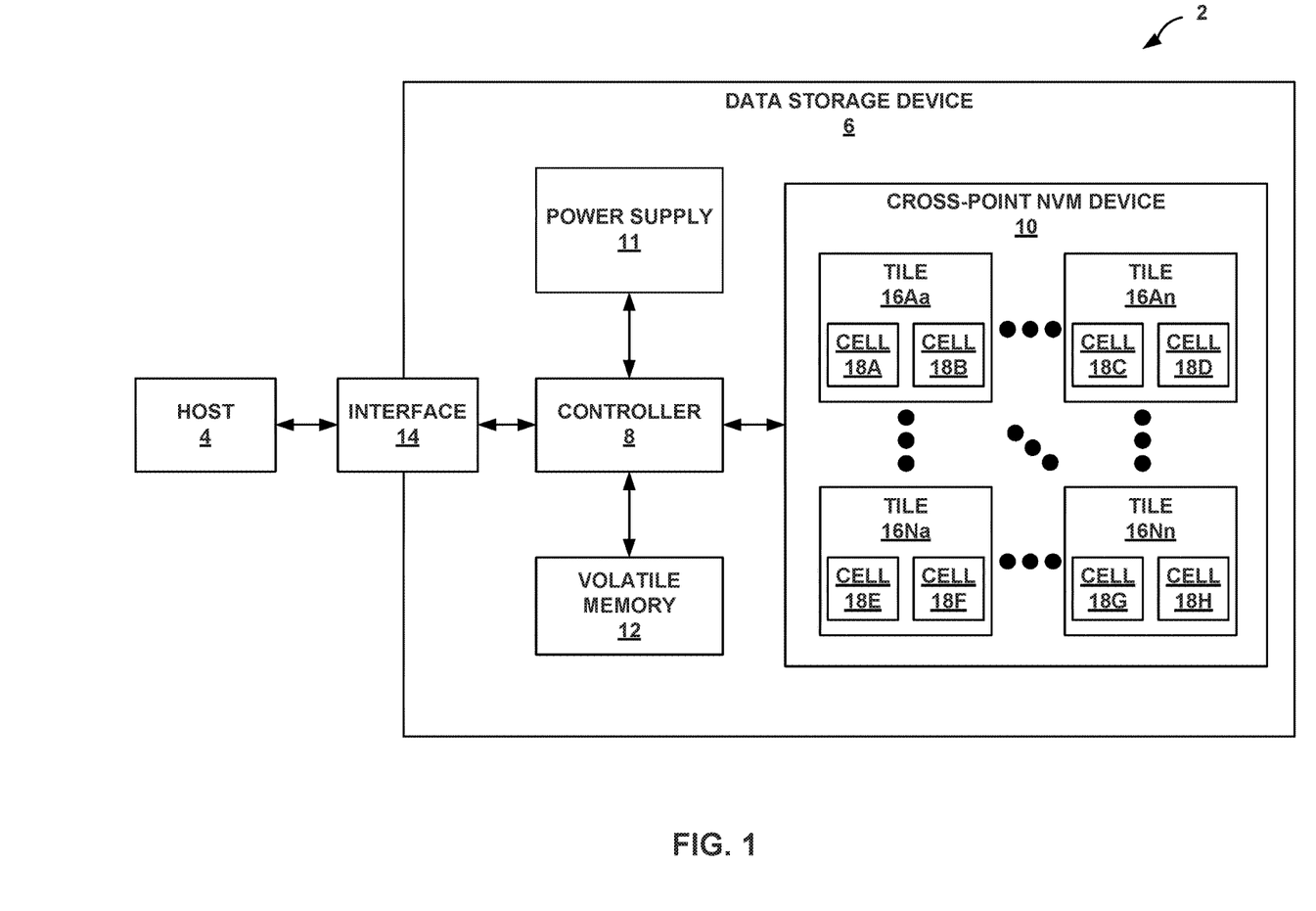
FIG. 1 is a conceptual and schematic block diagram illustrating an example storage environment in which a data storage device may execute subsets of I/O operations from a host device in parallel at a localized area of memory cells, in accordance with one or more techniques of this disclosure

FIG. 1 is a conceptual and schematic block diagram illustrating an example storage environment 2 in which a data storage device 6 may execute subsets of I/O operations from a host device 4 in parallel at a tile 16, in accordance with one or more techniques of this disclosure. For instance, host device 4 may store data to and/or retrieve data from one or more data storage devices 6. In some examples, storage environment 2 may include a plurality of data storage devices, such as data storage device 6, which may operate as a storage array. For instance, storage environment 2 may include a plurality of data storage devices 6 configured as a redundant array of inexpensive/independent disks (RAID) that collectively function as a mass data storage device for host device 4.

Host device 4 may include any computing device, including, for example, a computer server, a network attached storage (NAS) unit, a desktop computer, a notebook (e.g., laptop) computer, a tablet computer, a set-top box, a mobile computing device such as a "smart" phone, a television, a camera, a display device, a digital media player, a video gaming console, a video streaming device, or the like. Typically, host device 4 includes any device having a processor, which may refer to any form of hardware capable of processing data and may include a general-purpose processing unit, such as a central processing unit (CPU), dedicated hardware (such as an application specific integrated circuit (ASIC)), configurable hardware such as a field programmable gate array (FPGA) or any other form of processing unit configured by way of software instructions, microcode, firmware or the like.

As illustrated in FIG. 1, data storage device 6 may include controller 8, NVM device 10, power supply 11, volatile memory 12, and interface 14. In some examples, data storage device 6 may include additional components not shown in FIG. 1 for sake of clarity. For example, data storage device 6 may include a printed board (PB) to which components of data storage device 6 are mechanically attached and which include electrically conductive traces that electrically interconnect components of data storage device 6, or the like. In some examples, the physical dimensions and connector configurations of data storage device 6 may conform to one or more standard form factors. Some example standard form factors include, but are not limited to, 3.5" data storage device (e.g., an HDD or SSD), 2.5" data storage device, 1.8" data storage device, peripheral component interconnect (PCI®), PCI-extended (PCI-X®), PCI Express (PCIe®) (e.g., PCIe® x1, x4, x8, x16, PCIe® Mini Card, MiniPCI®, etc.), M.2, or the like. In some examples, data storage device 6 may be directly coupled (e.g., directly soldered) to a motherboard of the host device 4.

Data storage device 6 may include an interface 14 for interfacing with the host device 4. Interface 14 may include one or both of a data bus for exchanging data with host device 4 and a control bus for exchanging commands with host device 4. Interface 14 may operate in accordance with any suitable protocol. For example: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8.

Data storage device 6 may include a power supply 11, which may provide power to one or more components of data storage device 6. In response to operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components in response to operating in a shutdown mode, such as where power ceases to be received from the external device. In this way, power supply 11 may function as an onboard backup power source. Some examples of the one or more power storage components include, but are not limited to, capacitors, super capacitors, batteries, and the like.

Data storage device 6 also may include volatile memory 12, which may be used by controller 8 to store information. In some examples, controller 8 may use volatile memory 12 as a cache. For instance, controller 8 may store cached information in volatile memory 12 until the cached information is written to memory cells 16 of non-volatile memory array 10. Volatile memory 12 may consume power received from the power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Data storage device 6 includes at least one NVM device 10, of which only one is shown in FIG. 1 for purposes of clarity. NVM device 10 may include a plurality of cells 18A-18H (collectively, "cells 18") across a plurality of tiles 16Aa-16Nn (collectively, "tiles 16"). Each cell of cells 18 may implement cross-point memory architecture to store data. NVM device 10 may be configured to store relatively large amounts of data (e.g., 128 MB, 512 MB, 1 GB, 4 GB, 16 GB, 64 GB, 128 GB, 512 GB, 1 TB, etc.). In some examples, NVM device 10 may be one of a plurality of NVM devices of data storage device 6. In such examples, NVM devices 10 may all have the same capacity or NVM devices 10 may have different capacities.

In certain examples, some cells 18 of NVM device 10 may utilize other forms of memory (e.g., rather than exclusively utilizing cross-point technology). For example, some portion of NVM device 10 may include flash memory devices (e.g., NAND or NOR), ferroelectric random-access memory (FRAM), holographic memory devices, and any other type of non-volatile memory devices. In some examples, PCM, ReRAM, MRAM, and FRAM devices may have better endurance than flash NVM devices. In other words, PCM, ReRAM, MRAM, and FRAM devices may be capable of performing more read and/or write operations before wearing out compared to flash NVM devices.

Data storage device 6 includes controller 8, which may manage one or more operations of data storage device 6. For instance, controller 8 may manage the reading of data from and/or the writing of data to NVM device 10. Controller 8 may represent one of or a combination of one or more of a microprocessor, digital signal processor (DSP), application specific integrated circuit (ASIC), field programmable gate array (FPGA), or other digital logic circuitry.

In accordance with some techniques of this disclosure, in some examples, controller 8 may determine when and how to execute subsets of I/O operations in parallel within one or more tiles of NVM device 10 as described herein. In these examples, NVM device 10 may not perform these functions, but may instead only store the tiles 16 and cells 18 upon which the functions are executed. For example, controller 8 may determine when a plurality of I/O operations are to be written to a tile of a memory array of NVM device 10. In response to determining that the plurality of I/O operations are to be written to a tile 16, controller 8 may determine a series of subsets of I/O operations to be executed at a series of subsets of the cells 18. Each subset of cells 18 may be referred to hereinafter as a block. Each block or subset of cells 18 may be within a tile of tiles 16, and each tile 16 may include a plurality of blocks or subsets of cells 18. Further, in some examples, controller 8 may detect when a write current condition improves over the course of executing such subsets of I/O operations. Write current condition may improve when the amount of current that power supply 11 must generate to alter the electrical resistance of respective memory cells 18 decreases, such that power supply 11 may generate less current for an electrical pulse while the electrical pulse still reliably alters the electrical resistance state of respective memory cells 18. In response to the improving write current condition, controller 8 may modify (e.g., increase) the number of cells within the block to further increase write throughput.

In other examples, NVM device 10 may determine when and how to execute a plurality of I/O operations at a tile of NVM device 10, or NVM device 10 may perform some of these functions while controller 8 performs other functions. For example, NVM device 10 may detect when write current conditions improve, execute the actual I/O operations, or the like, while controller 8 determines the plurality of I/O operations to be executed at the tile and determines and/or updates the size of the blocks at which the plurality of I/O operations are executed in piecemeal. Therefore, though NVM device 10 is described throughout the disclosure as making the relevant determinations and managing the execution of a plurality of I/O operations in parallel in a tile for purposes of clarity, it is to be understood that it is contemplated and consistent with this disclosure for controller 8 to be making some or all of these determinations.

NVM device 10 may utilize PCM or ReRAM technology, and may alter the electrical resistive state of individual cells of cells 18 to store data. Tiles 16 do not need to be predetermined physical portions of NVM device 10, although tiles 16 may be predetermined physical portions of NVM device 10 in some examples. Instead, tiles 16 may be an allotment of cells 18 within which a plurality of electrical pulses of a plurality of I/O operations may be applied while allowing NVM device 10 to simultaneously apply a plurality of electrical pulses to a plurality of cells 18 within one or more neighboring tiles 16. Further, in some examples, tiles 16 may be an allotment of cells 18 that are each to undergo an I/O operation of the received plurality of I/O operations.

In certain examples, NVM device 10 may configure tiles 16 such that the configuration of power supply 11 and cells 18 upon the NVM array may be sufficient to generate electrical pulses that execute an I/O operation in each cell 18 of a bitline of the tile 16 in parallel.

Each cell 18 of a tile 16 may share at least one bitline or wordline with at least one other cell 18 of the tile 16. In some examples, each cell 18 of a tile 16 may share both a wordline and a bitline with at least one other cell 18 of the tile 16. In some examples, circuitry of data storage device 6 may be configured to deliver at least a current $I_{RESET}$ concurrently to each tile 16 of NVM device 10 at a given time. In certain examples, this current may be sufficient for each tile 16 of NVM device 10 to concurrently execute at least one RESET operation at a given time.

The RESET operation may change the electrical resistance of memory cell 18 from a relatively low resistance to a relatively high resistance by applying an electrical pulse of a specific amount of current ($I_{RESET}$) to the memristor of memory cell 18. Changing the electrical resistance of a cell 18 from a relatively low resistance to a relatively high resistance may include changing the stored logical state of a memristor of memory cell 18 (e.g., change a memristor that utilizes PCM technology from a crystalline state to an amorphous state). The SET operation may change the electrical resistance of memory cell 18 from a relatively high resistance to a relatively low resistance by applying an electrical pulse of another amount of current ($I_{SET}$) to the memristor of memory cell 18. Applying $I_{SET}$ to the memristor may change the stored logical state of a memristor of memory cell 18 (e.g., change a memristor that utilizes PCM technology from an amorphous state to a crystalline state).

Tiles 16 are depicted with two cells 18 for purposes of clarity. Each tile of tiles 16 may include any number of cells 18. The allotment of cells 18 within a tile 16 may be determined by analyzing the current requirements and voltage drop of write operations across cells 18 within a tile 16. For example, tile 16Aa may be sized to allow neighboring tiles 16Ab and 16Ba (not shown) to execute write operations in parallel with tile 16Aa. NVM devices 10 that are PCM devices may determine tile 16 size based on $I_{RESET}$, as $I_{RESET}$ is greater than $I_{SET}$ (e.g., it takes more current to put a memristor of a cell 18 in a relatively high-resistance RESET state than the amount of current it takes to put a memristor of a cell 18 in a relatively low-resistance SET state). In some examples, each tile 16 of NVM device 10 includes the same number of cells 18.

In accordance with the techniques of this disclosure, NVM device 10 may receive a plurality of I/O operations from controller 8. The I/O operations may ultimately originate from host 4 through interface 14, or the I/O operations may originate from controller 8. The plurality I/O operations may be received from controller 8 at a single period of time, or the plurality of I/O operations may be received over a period of time from controller 8. Even in examples in which controller 8 does not manage the parallel execution of a plurality of I/O operations to a tile, controller 8 may still perform some functions in executing the I/O operations. For example, controller 8 may convert the I/O operations from a first format used by host 4 to a second format used by NVM device 10, controller 8 may identify respective cells 18 and/or tiles 16 at which the I/O operations will be executed, or the like.

In some examples, each of the plurality of I/O operations may erase cells 18 of a tile 16, such that NVM device 10 will apply a RESET operation to each cell 18 of the tile 16. In other examples, each respective I/O operation of the plurality of I/O operations may program each respective cell 18 of a tile 16, such that NVM device 10 will apply a SET operation to each cell of the tile 16. The plurality of I/O operations may relate to all cells 18 of a tile 16 or a plurality of cells 18 of a tile 16. In other examples the plurality of I/O operations relate to all of the cells 18 of numerous tiles 16, such as each cell 18 of each tile 16 between tiles 16Aa and tile 16An. In yet other examples, the I/O operations relate to the cells 18 of one or more tiles 16, such as some cells 18 of tile 16Aa and some cells 18 of tile 16Nn. Other localized areas of cells 18 that are consistent with this disclosure are also possible.

In some examples, NVM device 10 may identify that the plurality of I/O operations is for specific tiles 16. For example, if the plurality of I/O operations relates to erasing certain data stored in cells 18A-18D, then NVM device 10 may identify the data as stored within tiles 16Aa-16An. In other examples, controller 8 or NVM device 10 may assign the plurality of I/O operations one or more tiles 16. For example, if the plurality of I/O operations relates to programming new data, controller 8 or NVM device 10 may assign the plurality of I/O operations to the cells 18 of tiles 16An and Na, for example. Controller 8 and/or NVM device 10 may assign the plurality of I/O operations to specific cells 18 and/or tiles 16 for electrical current reasons (e.g., assigning program requests to specific cells 18/tiles 16 to increase a number of write requests that may be concurrently executed given voltage drop across portions of bitlines and/or wordlines). In some examples, controller 8 or NVM device 10 may assign the I/O operation for NVM device 10 longevity reasons (e.g., alternating the location of writes to avoid impairing some cells 18 by a relatively high number of I/O operations). In some examples, NVM device 10 may randomly or pseudo randomly assign the I/O operations to tiles 16.

In some examples, NVM device 10 may detect that the plurality of I/O operations is to be executed at a certain number of cells 18. Further NVM device 10 may determine that the certain number of cells 18 is greater than a maximum number of cells 18 that may be included in a block. In response to detecting the certain number of cells is greater than a maximum number of cells 18 of a block, NVM device 10 may determine a first subset of I/O operations that may be executed at a first block of the tile 16. In some examples, NVM device 10 may only determine the first block, if I/O operations are the same for each cell 18 of the tile 16 (e.g., if the plurality of I/O operations all include RESET operations to erase cells 18, NVM device 10 may not individually determine an I/O operation for each cell 18).

NVM device 10 may determine the first block based on the amount of current that the power supply 11 is configured to provide to specific cells 18 and tiles 16. NVM device 10 may define the first block to include as many cells 18 of the tile 16 (and therein as many I/O operations of the plurality of I/O operations) as the power supply 11 is configured to provide sufficient current to a tile of tiles 16 for. For example, in some instances, the NVM device 10 may only be configured to supply a current sufficient to execute I/O operations at a certain number of cells 18 of a single bitline (e.g., the power supply 11 is configured to provide $I_{SET}$ for five cells 18 of a bitline to be erased but not $I_{SET}$ for six adjacent cells 18 of bitline to be erased). Further, in some instances the power supply 11 may only be configured to supply a current to execute I/O operations at a certain number of cells 18 of a single wordline (e.g., the power supply 11 is configured to provide $I_{SET}$ for six cells 18 of a wordline within a tile 18 to be erased but is not configured to provide $I_{SET}$ for seven cells 18 of the tile 16 to be erased). In this example, NVM device 10 may use this information to determine a block that is six cells 18 of a wordline by five cells 18 (e.g., the block includes thirty cells 18 that are arranged in a rectangle). A block may be a configuration/arrangement/shape of the cells 18 upon the surface of the NVM device 10. Other arrangements of cells 18 may be used in other examples as discussed herein, depending upon the arrangement of the tile 16, current capacity of NVM device 10, or other considerations. In this way, NVM device 10 may determine blocks that can be operated on substantially simultaneously, and which may result in better write throughput than sequential I/O operations.

NVM device 10 may select the individual cells in the first block such that some cells that share either a bitline or a wordline have at least one buffer cell on the respective bitline or wordline that is both not undergoing an I/O operation of the first subset of I/O operations and between respective cells that share either the bitline or the wordline. In some examples, NVM device 10 may select cells 18 of the first block such that respective buffer wordlines or buffer bitlines are between respective cells 18 of the first block that are in different wordlines or bitlines, respectively. However, for purposes of clarity, buffer bitlines are predominantly discussed herein for buffer cells. For example, using the six cells 18 by five cells 18 instance above, the first block may include thirty cells 18 that are in six bitlines, wherein none of the six bitlines of the first block are adjacent to each other. Depending upon the configuration of cells 18 upon NVM device 10, in some instances more than one buffer bitline may be between each bitline of the first subset of cells 18 (e.g., if cells 18 are relatively proximate on a surface of NVM device 10, two or three or more buffer bitlines may be utilized to provide insulation against thermal interference from adjacent I/O operation executions).

By selecting the first block such that none of the cells 18 of the first block occupy adjacent bitlines, NVM device 10 may reduce the possibility of interference negatively impacting the integrity of the I/O operations (e.g., as a result of thermal interference). Having I/O operations performed substantially simultaneously could lead to localized hot spots in NVM device 10. Since cells 18 switch states based on thermal effects, localized hotspots could cause adjacent cells 18 (e.g., cells within a same block/tile or cells not within a same block/tile) to be improperly switched, potentially leading to errors. The buffer cells may reduce the concentration of current within a small area of the NVM device 10, which may therein reduce localized heating and reduce a chance of a cell being inadvertently switched. Further, by executing subsets of the plurality of I/O operations to a plurality of cells 18 in blocks, NVM device 10 may increase write throughput by increasing the amount of I/O operations that can be executed in a given time.

Figure 2:
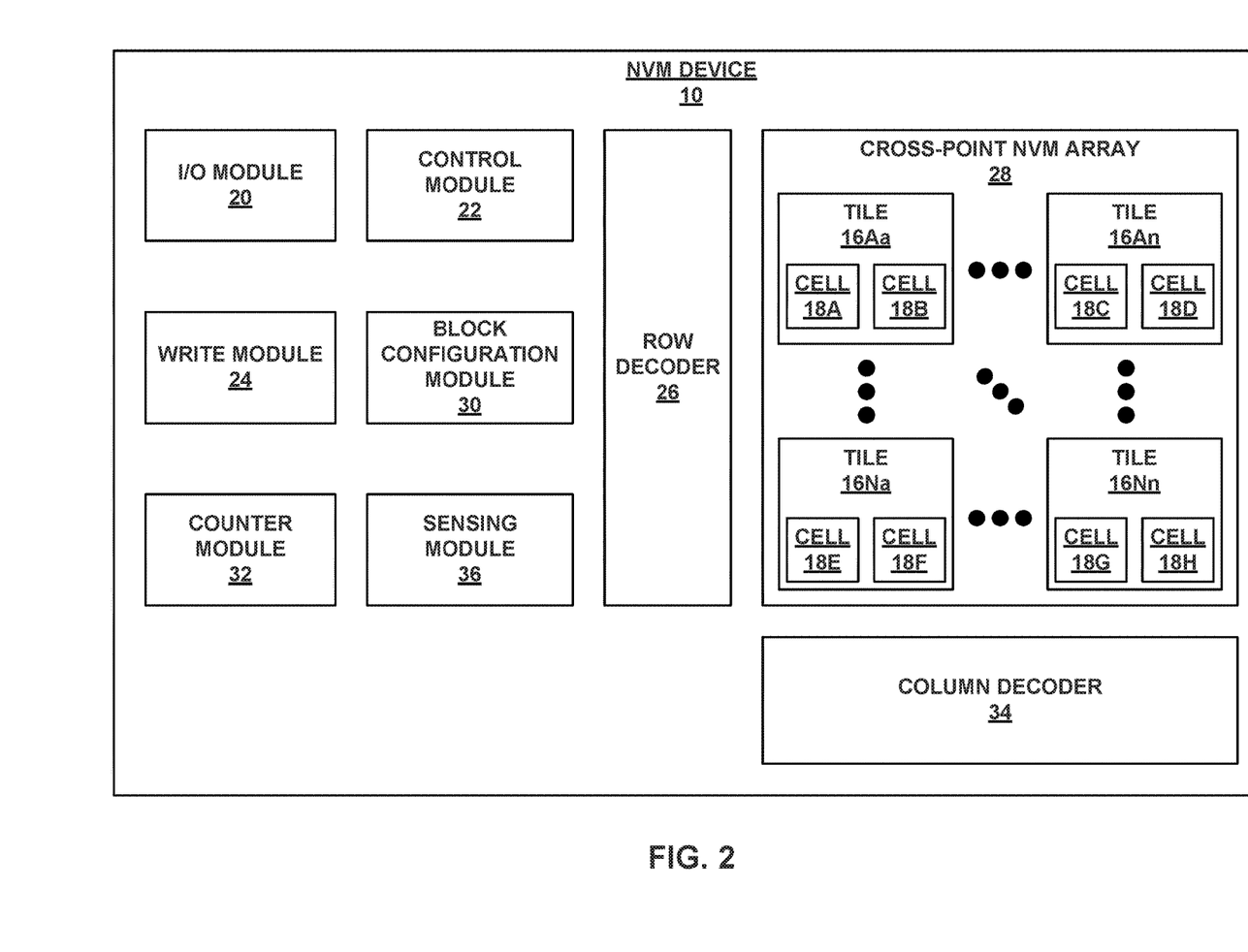
FIG. 2 is a conceptual and schematic block diagram illustrating example components of a memory device, in accordance with one or more techniques of this disclosure.

FIG. 2 is a conceptual and schematic block diagram illustrating example components of a NVM device 10, in accordance with one or more techniques of this disclosure. NVM device 10 may include I/O module 20, control module 22, write module 24, row decoder 26, memory array 28, block configuration module 30, counter module 32, column decoder 34, and sensing module 36, as shown in FIG. 2. In some examples, NVM device 10 may include more or fewer components than those shown in FIG. 2, or functions attributed to multiple modules shown in FIG. 2 may be implemented in a single module. Each of the modules illustrated in and described with respect to FIG. 2 may be implemented in hardware, firmware, software, or combinations thereof, and different modules may be implemented differently. Memory array 28 may include tiles 16 and cells 18 as described above.

NVM device 10 is illustrated as including modules (e.g., module 22 and block configuration module 30) that are described as performing techniques of this disclosure. As discussed above, in alternate examples, some or all the functions attributed to these modules herein (e.g., control module 22 or block configuration module 30) may instead be performed by controller 8 of data storage device 6 (FIG. 1). Although examples below predominantly discuss determinations made in the context of a single tile 16 for purposes of clarity, it is to be understood that control module 22 may make such determinations for a plurality of tiles 16 sequentially or concurrently. For example, control module 22 may be configured to execute a plurality of I/O operations in parallel at a tile 16, as discussed herein for numerous tiles 16 of memory array 28 at a same time, such that control module 22 is managing numerous sets of plurality of I/O operations to be written to numerous tiles 16, or such that control module 22 is managing a single plurality of I/O operations that is to be executed at numerous tiles 16.

Controller 8 may send a plurality of I/O operations to NVM device 10 that are received by I/O module 20. In some examples, I/O module 20 may convert information of the plurality of I/O operations from a first format used by host 4 or controller 8 to a second format used by NVM device 10. I/O module 20 may organize incoming I/O operations into one or more queues (e.g., a queue for each tile 16 or for each NVM device 10 of NVM array 28). The one or more queues may be pseudo-constantly updated as new I/O operations are received by I/O module 20 and control module 22 manages the execution of queued I/O operations. In some examples, a plurality of I/O operations to be executed in parallel at a tile 16 is received in a single transmission to I/O module. In other examples, said plurality of I/O operations may be received over a number of transmissions, or said plurality of I/O operations may be received one or more at a time until control module 22 assembles all I/O operations into the plurality of I/O operations.

Write module 24 may manage one or more aspects of writing data to memory array 28. For example, write module 24 may execute I/O operations to memory array 28 by selecting cells 18 of the block of a tile 16 within memory array 28 to execute, in parallel, a subset of the plurality of I/O operations the data of the I/O operations as described herein. Write module 24 may direct and define a plurality of electric pulses to the block using row decoder 26 and column decoder 34. Write module 24 may define an electrical pulse by specifying a current or voltage of an electrical pulse. Row decoder 26 and column decoder 34 may route the plurality of electrical pulses to the block so that a single cell 18 of a given row and column is accessed per electrical pulse. Directing an electric pulse to the selected cells 18 may alter an electrical resistance state of the block, storing the erase or program operation for each cell 18 of the block.

For example, write module 24 may execute a plurality of I/O operations that include erase operations (e.g., SET operations). Write module 24 may determine that the plurality of erase I/O operations are to be performed to the cells 18 of tile 16Aa. Control module 22 may determine that a first set of cells 18 may include cell 18A. For example, if NVM device 10 is a PCM device, a memristor of cell 18A may initially be in an amorphous state with relatively high electrical resistance to store a value of, e.g., a logical one. Write module 24 may generate a set of electrical pulses with a maximum current of $I_{SET}$ for the block. Row decoder 26 and column decoder 34 may direct the electrical pulse to the cells 18 of the first block, including cell 18A. For example, if NVM device 10 is a PCM device, a memristor of cell 18A may become crystalline with relatively low electrical resistance to store a value of logical zero.

As another example, write module 24 may execute a plurality of I/O operations that include programming (e.g., RESET) operations. Write module 24 may determine that the plurality of I/O operations are to be performed to tile 16An. Control module 22 may determine a first block for write module 24 to write to. The first block may include cell 18C. A memristor of cell 18C may initially have relatively low electrical resistance to store a value of, e.g., a logical zero. Write module 24 may use power supply 11 to generate a plurality of electrical pulses with a maximum current of $I_{RESET}$. Row decoder 26 and column decoder 34 may direct the electrical pulse to the selected cell, e.g., cell 18B, such that the memristor of cell 18C (among other memristors of the block) has a relatively high electrical resistance to store a value of logical one.

In some examples, control module 22 may determine whether to execute subsets of a plurality of I/O operations in parallel to a tile 16. Control module 22 may thusly execute subsets for any one or more of a number of reasons, such as the proximity of the plurality of cells 18 that the I/O operations are to be executed at satisfying a localization threshold (e.g., where the plurality of cells 18 have at least nineteen out of every twenty cells 18 adjacent to at least one other cell 18 of the plurality of cells 18, or where the plurality of cells 18 comprise at least 75% of the cells 18 of respective tiles 16). Other reasons may include the number of I/O operations within the plurality of I/O operations satisfying a threshold, detecting a user input (e.g., the user input instructing data storage device 6 to execute subsets of a plurality of I/O operations in parallel to tiles 16), detecting an urgency of the plurality of I/O operations (e.g., when an incoming batch job of I/O operations includes a flag that indicates that the batch job must be executed within an amount of a time that satisfies a predetermined threshold), or the like. Control module 22 may cause block configuration module 30 to determine the blocks that the plurality of I/O operations are to be written to.

Block configuration module 30 may analyze the plurality of I/O operations to determine blocks to which subsets of I/O operations will be written in parallel. Block configuration module 30 may determine a block size for one or more tiles 16 that will be written to as part of the execution of the I/O operations. In certain examples, block configuration module 30 may determine a block size for each tile 16 that will be written to. In other examples, block configuration module 30 may only determine a block size for tiles 16 that have a number/percentage of cells 18 that will be written to that satisfy a threshold. It is to be understood that, while blocks are predominantly discussed as being generally rectangular herein, blocks may be any shape that is configured to execute parallel I/O operations to cells 18 of a tile 16 using buffer bitlines.

In some examples, after a first subset of I/O operations is executed, block configuration module 30 may determine a second block at which a second subset of I/O operations of the plurality of I/O operations is to be executed. Block configuration module 30 may determine the second block in a substantially similar manner as block configuration module 30 determined first block (e.g., determining first block such that number of cells 18 within first subset is increased by considering current density of the tile 16).

In some examples block configuration module 30 may determine a first block such that a second (and third, and fourth, etc.) block naturally follows. For example, using the instance above where block configuration module 30 determined a five by six block, a rectangular tile 16 may be ten by twelve cells 18. Block configuration module 30 may determine that four series of I/O operations executed in parallel across 30 cells 18 at a time may be able to execute the entirety of the plurality of I/O operations following four occurrences (e.g., as 120 I/O operations executed at a rate of 30 I/O operations per occurrence will be finished after four occurrences). Block configuration module 30 may determine to locate each subsequent block to relatively adjacent sets of bitlines (e.g., where a first block is at wordlines 1-5 and bitlines 1, 3, 5, 7, and 9, a second block may be at wordlines 1-5 and bitlines 2, 4, 6, 8, and 10). In response to write module 24 detecting that a block occupies an edge of a tile 16 (e.g., the tile 16 has no more bitlines that are adjacent to an active block), write module 24 may locate a subsequent block at an adjacent set of wordlines of the tile 16 (e.g., write module 24 may determine a third instance of the block at wordlines 6-10 and bitlines 1, 3, 5, 7, and 9). If block configuration module 30 is configured in this way, block configuration module 30 may determine a size of a block one time, after which write module 24 may determine new instances of blocks of the same size that are located adjacent to the previous subset of cells, executing I/O operations until the plurality of I/O operations are all executed.

Buffer bitlines, as described herein, are bitlines that are between cells 18 of a block that do not include any cells 18 within that instance of the block. Cells 18 of a block may have one or a plurality of buffer bitlines between themselves and cells 18 of a different bitline of a block. Though such buffers between cells 18 in a particular block of cells 18 are primarily discussed herein as being in bitlines for purposes of clarity, in some examples buffers may also be in wordlines. Put differently, in some examples, block configuration module 30 may utilize buffer wordlines in a block, such that cells 18 of a wordline of a block are adjacent to wordlines that have no cells 18 of the block. In other examples, block configuration module 30 may utilize both buffer wordlines and buffer bitlines, such that cells 18 of a block are never directly adjacent to other cells 18 of a block.

Block configuration module 30 may determine the size of blocks in which subsets of the plurality of I/O operations are to be written by analyzing the current density and voltage drop of a tile 16. For example, the more cells 18 block configuration module 30 includes within a block of a certain physical size (e.g., an amount of space upon the face of a silicon surface of memory array 28), the higher the voltage drop and current density may be. At some point, the voltage drop and current density may be high enough to impact the integrity of I/O operations (e.g., by dissipating current of electrical pulses such that an amount of current falls below $I_{RESET}$ for program operations and $I_{SET}$ for erase operations for some or all cells 18 of a block, or by increasing write activity enough in a localized area that temperature rises to a point that it can affect the integrity of writes, as discussed above). Block configuration module 30 may determine voltage drop and current density using sensing module 36, which identifies changing and/or static electrical values of NVM device 10. Block configuration module 30 may avoid this by decreasing an amount of cells 18 within a block or increasing the physical size of the block. In this way, block configuration module may increase an amount of cells 18 within a block to increase write throughput while simultaneously decreasing a chance for I/O operation execution failure (e.g., as a result of insufficient current).

Block configuration module 30 may configure blocks with buffer bitlines and/or buffer wordlines between cells 18. Buffer bitlines and buffer wordlines may be located between cells 18 of a block that are in different bitlines or wordlines, respectively. In some examples, a block may include one buffer bitline/wordline between cells 18 of different bitlines/wordlines of the block, respectively. In other examples, a block may include two or more buffer bitlines/wordlines between cells 18 of different bitlines/wordlines of the block, respectively. Buffer bitlines and buffer wordlines may reduce the chance of interference (e.g., thermal interference that alters the state of memristors in undesired manners) between cells 18 of a block as a result of high write throughput.

In some examples, block configuration module 30 may determine blocks such that a first block may be iteratively executed to and relocated (e.g., moved to an adjacent set of bitlines) until the plurality of I/O operations are fully executed. For example, block configuration module 30 may determine a block configuration that executes 20% of the I/O operations of the plurality of I/O operations for a given tile 16. Further, the block configuration module 30 may configure the block shape such that write module 24 may advance a block relative to the tile to include a new set of cells 18 that relate to a next 20% of the I/O operations. For example, block configuration module 30 may configure blocks such that a first block includes a first subset of cells 18 and a second block includes a second subset of cells 18, wherein each of the first subset of cells 18 are adjacent to each of the second subset of cells 18.

Block configuration module 30 may configure blocks in this way such that write module 24 may advance blocks in a similar manner after each subset of I/O operations is executed until the plurality of I/O operations are executed. Write module 24 may use counter module 32 to track the progress of using blocks to execute the plurality of I/O operations. For example, using the case above, each block may include 20% of the cells 18 of a tile 16, where each cell 18 of the tile 16 is to undergo a respective I/O operation. Counter module 32 may determine that five blocks may write all of the plurality of I/O operations, and therein determine a final count of five. After each execution of a subset of I/O operations counter module 32 may increase an ongoing count subset executions, until the final count is achieved and the plurality of I/O operations are executed. In this way write module 24, block configuration module 30, and counter module 32 may quickly execute the entirety of a plurality of I/O operations after determining a block configuration and count.

Figure 3:
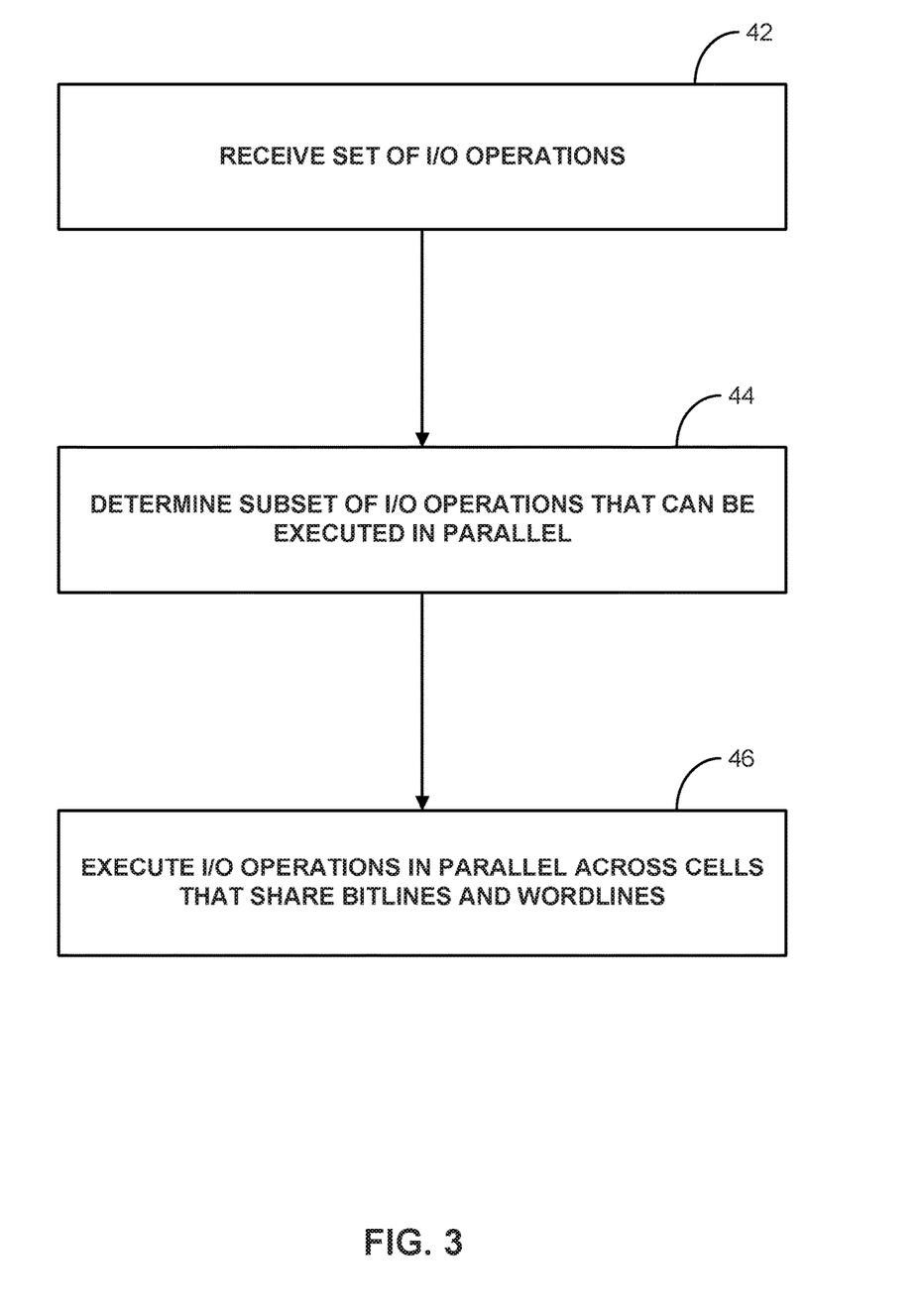
FIG. 3 is a flow diagram illustrating an example technique for executing I/O operations to a memory device, in accordance with one or more techniques of this disclosure.

FIG. 3 is a flow diagram illustrating an example technique for executing write operations to a NVM device 10, in accordance with one or more techniques of this disclosure. In some examples, NVM device 10 may be configured to execute a plurality of I/O operations at blocks in parallel when possible. For example, row decoder 26 may open a bitline of a block, after which column decoder 34 may sequentially open wordlines until all cells 18 of the bitline of the block have been written to. This may be repeated (e.g., repeated in a serpentine manner) until all cells of a block have been written to. Further, in some examples it may be possible to execute a plurality of I/O operations at blocks in parallel when each of the plurality of I/O operations is a program operation, when each of the plurality of I/O operations is an erase operation, or when control module 22 can group a sufficient number of I/O operations together (e.g., together into a tile 16). In certain examples, the technique of FIG. 3 may begin by determining whether to execute a plurality of I/O operations at blocks in parallel. Controller 8 (FIG. 1) or control module 22 may determine whether to execute a plurality of I/O operations at subsets of cells in parallel, though the technique of FIG. 3 is described with reference to control module 22 of FIG. 2 for purposes of clarity.

Control module 22 may access a log or table to determine user or system preferences for whether to execute a plurality of I/O operations at blocks in parallel. For example, a table may indicate that system settings (e.g., settings of data storage device 6) include executing a plurality of I/O operations at blocks in parallel for a NVM device 10 in response to the plurality of I/O operations including, more than ten I/O operations. In other examples, control module 22 may verify that the plurality of cells 18 to which the plurality of I/O operations will be written are sufficiently proximal/localized. The plurality of cells 18 being proximal/localized may mean that each of the plurality of cells 18 are within a single tile 16, or within a number of adjacent tiles 16. In some examples, the plurality of cells 18 being proximal/localized may mean a number or percentage of cells 18 that are not undergoing an I/O operation as part of the plurality of I/O operations yet are between/within the plurality of cells 18 is below at or below a threshold amount. In certain examples, the percentage/number may be zero, such that a single cell 18 not undergoing an I/O operation of the plurality of I/O operations yet being between two other cells 18 that are undergoing an I/O operation of the plurality of I/O operations may result in control module 22 not executing a plurality of I/O operations in blocks in parallel as described herein. In other examples, data storage device 6 may be configured to always execute a plurality of I/O operations at a block in parallel as described herein.

The technique of FIG. 3 may include receiving, by control module 22, a plurality of I/O operations (42). For example, the plurality of I/O operations may be received from host 4 by interface 14 of data storage device 6. Controller 8 may then receive the plurality of I/O operations from interface 14 and transmit the plurality of I/O operations to I/O module 20 of NVM device 10. Control module 22 may receive the plurality of I/O operations from I/O module 20. In some examples, the plurality of I/O operations are to be performed at a plurality of tiles 16. In other examples, the plurality of I/O operations are to be performed at a single tile of tiles 16, or control module 22 may assign all of the I/O operations to a single tile of tiles 16. Regardless, control module 22 may determine that the plurality of I/O operations are to be written to a tile 16. Control module 22 may determine the one or more tiles 16 to which the plurality of I/O operations will be written, and determine whether or not the plurality of I/O operations include SET operations or RESET operations (or perhaps both).

Control module 22 may then cause block configuration module 30 to determine block configurations (44). In some example, this step may be omitted, as block size may be predetermined. Block configuration module 30 may determine both a general shape of and an amount of cells 18 within a block. As discussed herein, block configuration module 30 may use the current density and the predicted voltage drop to determine a shape and an amount of cells 18 of a block. While block configuration module 30 may configure blocks to be any shape, in some examples block configuration module 30 may use rectangular blocks due to a rectangular geometry of memory array 28.

Block configuration module 30 may configure blocks such that a block includes cells 18 across numerous bitlines and wordlines. A block as configured by block configuration module 30 may have cells that share a bitline or wordline with other cells of the block. Alternatively, in some examples, block configuration module 30 may configure blocks such that only some blocks have cells that share a bitline and/or a wordline with other cells of the block. Block configuration module 30 may configure blocks such that some blocks include buffer cells. In some examples, block configuration module 30 may configure blocks such that each cell 18 of a block has at least one buffer bitline between other cells 18 of other bitlines of the block. Alternatively, block configuration module 30 may configure blocks such that each cell 18 of a block has at least one buffer wordline between cells 18 of other wordlines of the block. Alternatively, block configuration module 30 may configure blocks such that each cell of a block has both at least one buffer wordline between cells 18 of other wordlines of the block and also has at least one buffer bitline between cells 18 of the other bitlines of the block.

In some examples, block configuration module 30 may configure blocks such that blocks are fully within a single tile 16. Block configuration module 30 may configure blocks to only include cells 18 of a single tile 16 even if the plurality of I/O operations is to be written to cells 18 of a plurality of tiles 16. When the plurality of I/O operations is to be written to cells 18 of a plurality of tiles 16, block configuration module 30 may determine a block configuration for multiple tiles 16 or for each tile 16. In some examples, block configuration module 30 may determine a single block configuration that may be used by write module 24 to write to each tile 16. In other examples, block configuration module 30 may determine relatively few (e.g., one or two) block configurations that may be used by write module 24 to write to relatively many (e.g., ten or twenty) tiles 16. Configuring blocks such that a single block configuration may be used to write to numerous tiles 16 may lead to performance benefits by using less processing power to execute the I/O operations.

Block configuration module 30 may configure blocks such that a single block configuration may be used iteratively within one or more tiles 16 to execute I/O operations to all of the cells 18 that are to be written to. For example, block configuration module 30 may configure a block to be a rectangle that can move through the tile 16 to include very cell 18 of the tile 16. In some examples, block configuration module 30 may configure a block to scale down to a respective tile 16 so that write module 24 may use a single block configuration to execute I/O operations for each block. For example, a block configuration module 30 may use sensing module 36 to determine that a maximum block size (e.g., maximum as defined by voltage drop and current density of a memory array 28) is eleven wordlines by six bitlines for a tile 16 that is thirty wordlines by twenty bitlines. In such an example, block configuration module 30 may scale back from the maximum block to a block size often wordlines by five bitlines, as a 10×5 block may iteratively fit into a 30×20 tile 16 while a 11×6 block may not.

Control module 22 may then cause write module 24 to use the block configured by block configuration module 30 to write a subset of the plurality of I/O operations to cells 18 of the block in parallel (46). As discussed herein, the cells 18 of the block may all be in a single tile 16. In some examples, write module 24 may simultaneously (or substantially simultaneously) use the same or different blocks to write to other blocks. In such examples, the other blocks may all be writing to a single tile 16, such that a plurality of tiles 16 are each undergoing a plurality of I/O operations at a plurality of cells 18 at a given time. For example, row decoder 26 may open a respective bitline for each block, after which column decoder 34 may open one wordline for each block (or one wordline for multiple blocks, if multiple blocks share a wordline). Following this, column decoder 34 may open a next wordline for each block while the bitline for each block is still open. Column decoder 34 may continue sequentially opening wordlines until all cells 18 of the bitline of all the block have been written to. This may be repeated (e.g., repeated in a serpentine manner) until all cells of all block have been written to.

Figure 4:
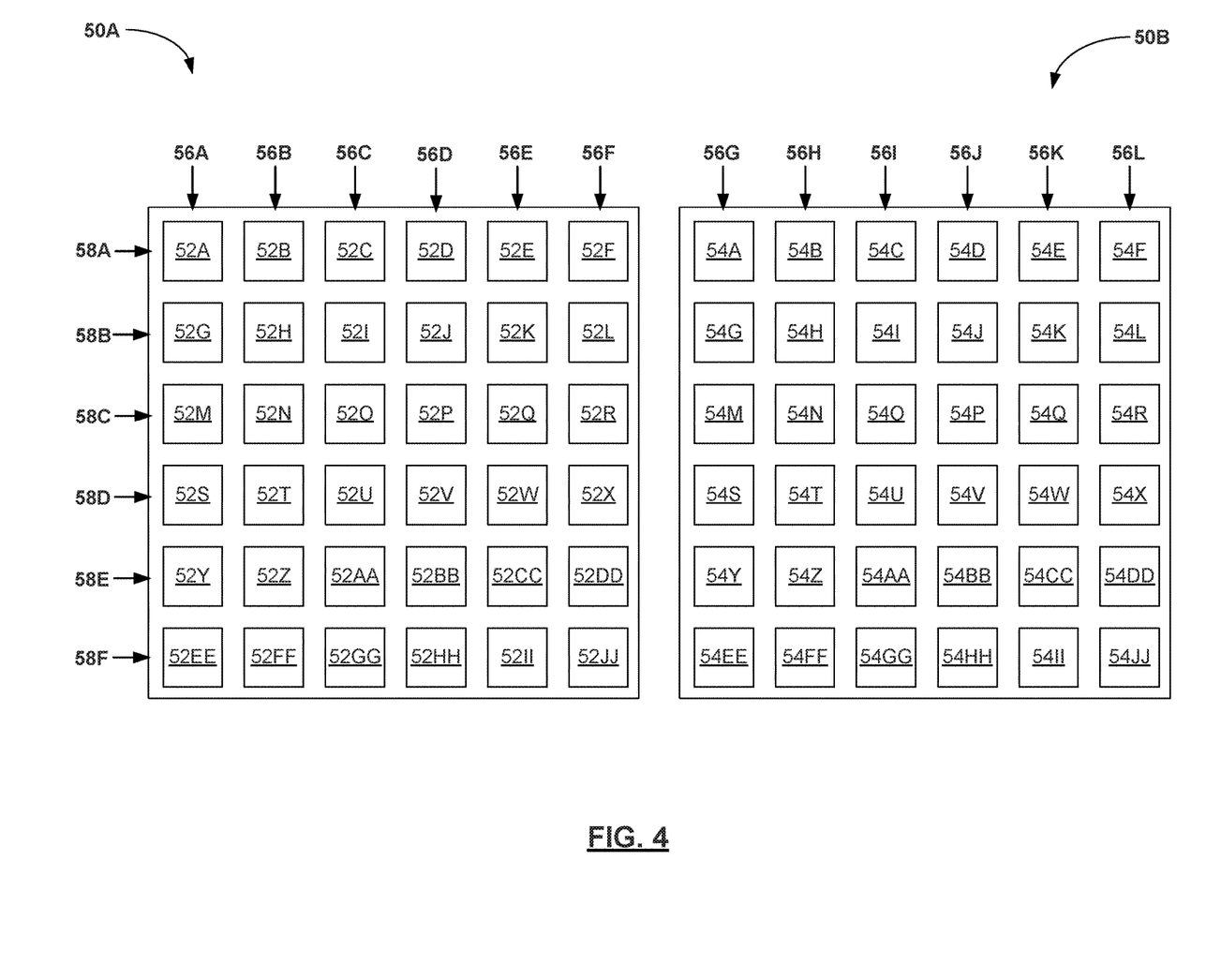
FIG. 4 depicts example blocks of example data cells of a NVM device.

FIG. 4 depicts two tiles 50A-50B (collectively "tiles 50"), where a first tile 50A includes a plurality of cells 52A-52JJ (collectively "cells 52") and a second tile 50B includes a plurality of cells 54A-54JJ (collectively "cells 54"). Tiles 50 may be substantially similar to tiles 16, and cells 52, 54 may be substantially similar to cells 18. Tiles 50 may be arranged on bitlines 56A-56L (collectively "bitlines 56") and wordlines 58A-58F (collectively "wordlines 58").

I/O circuit 20 may receive a plurality of I/O operations. Control module 22 may determine that the plurality of I/O operations are to be written to each cell 52, 54 of tile 50A and tile 50B. As an example, control module 22 may further determine that each I/O operation of the plurality of I/O operation may include RESET operations to erase the cells 52, 54 of the tiles 50. Control module 22 may cause block configuration module 30 to use sensing module 36 to determine the current density and predicted voltage drop. Control module 22 may cause sensing module 36 to determine current density and predicted voltage drop on a periodic basis, such as after a threshold number of writes or after a threshold amount of time has passed. Alternatively, control module 22 may cause sensing module 36 to determine current density and predicted voltage drop in response to detecting a physical change to some component of data storage device 6, such as the replacement of power supply 11. Alternatively, in some examples, current density and predicted voltage drop may be predetermined, such that control module 22 may not cause sensing module 36 to determine current density and predicted voltage drop. or in response to a triggering. Using the data of the current density and voltage drop, block configuration module may determine that a 4×2 block (e.g., four bitlines 56 by two wordlines 58) is the maximum block sized allowed by current density and voltage drop. Block configuration module 30 may further determine that a 4×2 block may not iterate properly into a 6×6 tile 50 (e.g., as four wordlines does not evenly divide into six wordlines), and may therein configure a 3×2 block. The block may include buffer bitlines and/or buffer wordlines between cells 52, 54 of different bitlines 56 and/or wordlines 58 of the block, respectively. The block may be configured for both tiles 50.

Control module 22 may cause counter module 32 to determine a number of iterations that it may take for a 3×2 block to write to every cell 6×6 tile 50. Counter module 32 may determine that it will take six iterations for a 3×2 block with buffer bitlines to write to every cell of a 6×6 tile. Counter module 32 may therein set a count to one.

Write module 24 may write to a first subset of cells 52, 54 in both tiles 50 using the block. The first subset of cells 52 for the first tile 50A may be 52A, 52G, 52C, 52I, 52E, and 52K. The first subset of cells 54 for the second tile 50B may be 54A, 54G, 54C, 54I, 54E, and 54K. Buffer bitlines 56 may include bitlines 56B, 56D, 56H, and 56J. Bitline 56F may act as a buffer bitline 56 between blocks of the first tile 50A and the second tile 50B. Write module 24 may write to the blocks using a plurality of electrical pulses of the power supply 11 routed to the intended cells 52, 54 using row decoder 26 and column decoder 34.

Counter module 32 may detect this completed subset of I/O operations and add one to the count, such that the count is two. Write module 24 may write to a second subset of cells 52 of the first tile 50A and a second subset of cells 54 of the second tile. The second subset of cells 52 for the first tile 50A may include cells 52B, 52H, 52D, 52J, 52F, and 52L. The second subset of cells 54 for the second tile 50B may include cells 54B, 54H, 54D, 54J, 54F, and 54L. Counter module 32 may detect the completed subset of I/O operations and add one to the count, such that the count is three. Write module 24 may detect that the block is at the edge of the tile 50 and move both blocks down to the next two wordlines 58C, 58D. In this way write module 24 may continue writing to the tiles 50 until counter module 32 detects that the tiles 50A, 50B are entirely erased as the count (e.g., seven) is greater than the number of iterations counter module 32 determined would be needed to completely erase the cells 52, 54 of the tiles 50.

In some examples, I/O circuit 20 may then receive a second plurality of I/O operations to be written to each cell 52, 54 of tile 50A and tile 50B. Control module 22 may further determine that each I/O operation of the plurality of I/O operation may include RESET operations to program the cells 52, 54 of the tiles 50. Control module 22 may cause block configuration module 30 to use sensing module 36 to determine the current density and predicted voltage drop. Using the data of the current density and voltage drop, block configuration module 32 may determine that a 5×4 block (e.g., five bitlines 56 by four wordlines 58) is the maximum block size allowed by current density and voltage drop. When NVM device 10 is a PCM device, the maximum block size may be smaller for program operations than erase operations, as RESET operations generally require more current than SET operations. Further, in some examples write conditions may improve as further I/O operations are executed (e.g., power supply 11 may generate less current for an electrical pulse while the electrical pulse still reliably alters the electrical resistance state of respective memory cells 18).

Block configuration module 30 may therein determine a 3×3 block configuration so that iterations may fit within the tiles 50. Counter module 32 may determine that four iterations are necessary to write to all cells 52, 54 of the tiles 50. In this way, control module 22 may have block configuration module 30 determine block configurations for each incoming plurality of I/O operations to increase opportunities to increase write throughput of NVM device 10.

In some examples, control module 22 may configure tiles 50 such that block configuration module 32 may be able to configure blocks that occupy the entire bitline 56 of the tile 50 even in the most limiting situation. For instance, continuing the example above, due to current density and voltage drop, blocks may not be able to be bigger than 4×2 in the most limiting instance (e.g., when NVM device 10 is a PCM device and the plurality of I/O operations are RESET operations, as RESET operations require more current). Therefore, control module 50 may configure tiles 50 to be no more than four wordlines 58 tall, such that every block may be able to span the entirety of the bitlines 56 of the tile 50. Configuring tiles 50 in this way may reduce the amount of processing that write module 24 may have to do, simplifying the process. Put differently, if blocks always spanned the length of bitlines 56 of tiles 50, write module 24 may not have to determine when to move a block down as a result of a block being at the edge of a tile 50 before counter module 32 has reached a final count; instead, write module 24 may also move a block in one direction until counter module 32 indicates that the count has been reached (and therein the plurality of I/O operations have been executed).

In some examples, control module 22 may determine that the plurality of I/O operations are localized largely substantially on a border between tiles 50. In such examples, control module 22 may cause block configuration module 30, counter module, 32, and write module 24 to coordinate the execution of the plurality of I/O operations across the tiles 50. For example, control module 22 may determine the plurality of I/O operations is to be written to the bitline 56F of tile 50A and bitline 56H of tile 50B (e.g., cells 52F, 52L, 52R, 52X, 52DD, 52JJ, 54A, 54G, 54M, 54S, 54T, and 54EE), such that bitlines 56F and 56G are adjacent within memory array 18. Block configuration module 30 may determine a block of 1×3, and control module 22 may cause counter module 32 to determine a final count of 4 to accommodate the execution to both tiles 50. Control module 22 may cause write module 24 to not write to alternating tiles 50 on alternating counts to avoid thermal interference. For example, on a first count write module 24 may only write to three cells 52F, 52L, 52R of the first tile 50A, on a second count write module 24 may only write to three cells 54A, 54G, 54M of the second tile 50B, on a third count write module 24 may only write to three cells 52X, 52DD, 52JJ of the first tile, and on the fourth count write module 24 may only write to three cells 54S, 54T, 54EE of the second tile 50B. In this way, NVM device 10 may execute a plurality of I/O operation at a localized area at a border of tiles 50.

Figure 5:
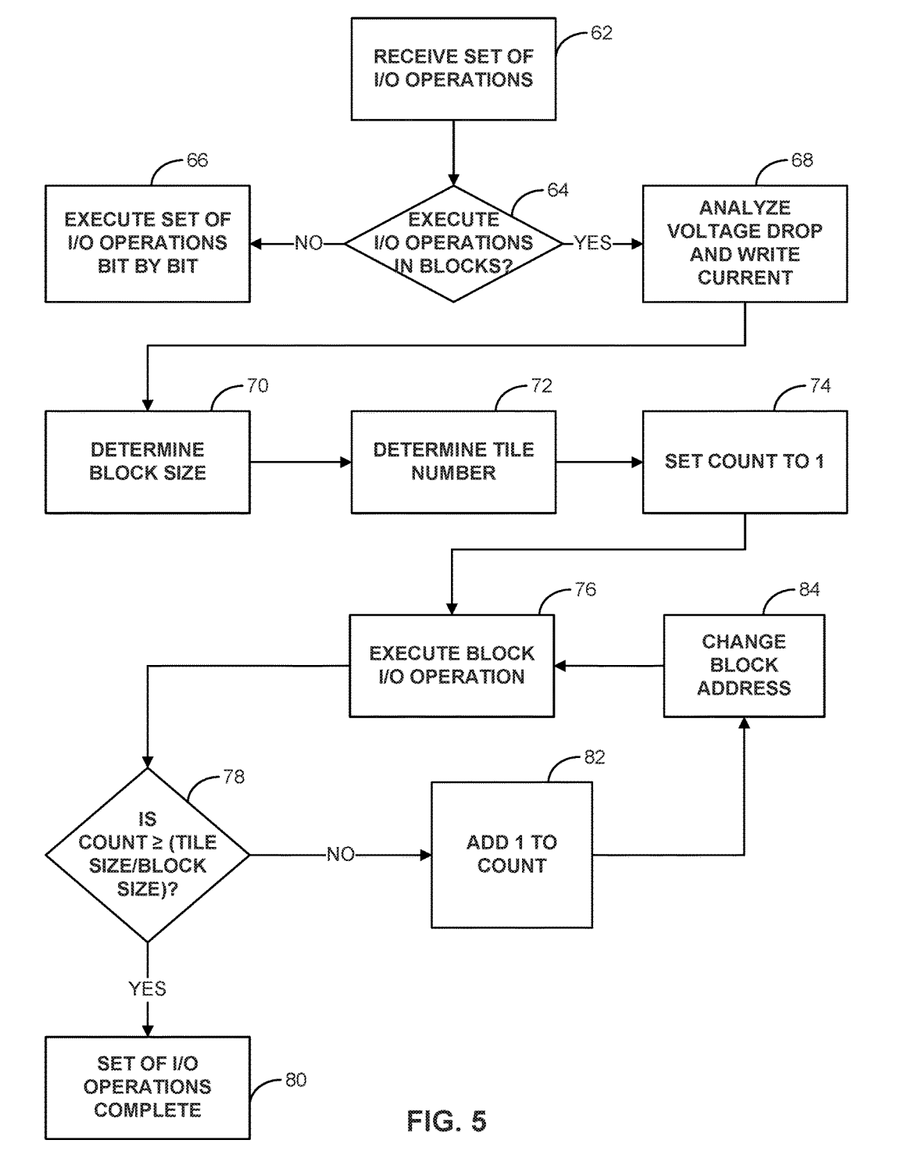
FIG. 5 is a flow diagram illustrating an example technique for executing I/O operations to a memory device, in accordance with one or more techniques of this disclosure.

FIG. 5 is a flow diagram illustrating an example technique for executing I/O operations to NVM device 10, in accordance with one or more techniques of this disclosure. I/O module 20 of NVM device 10 may receive a plurality of I/O operations (62). Control module 22 may determine whether to execute the plurality of I/O operations in parallel subsets of I/O operations using blocks (64). Control module 22 may determine whether to execute the I/O operations using various factors as described herein. If control module 22 determines to not execute the plurality of I/O operations in parallel subsets ("NO" path of 64), write module 24 may execute I/O operations of the plurality of I/O operations bit by bit (66).

Control module 22 may determine to execute the plurality of I/O operations in parallel operations using blocks ("YES" path of 64). In response to determining to execute the plurality of I/O operations in parallel, sensing module 36 may analyze voltage drop and current density. Control module 22 may use this information to determine write current. Using the voltage drop, current density, and/or write current, control module 22 may cause block configuration module 30 to determine block configuration (70). Block configuration may include a size and a shape of a block, as discussed herein. Blocks may have buffers between cells 18, such as buffer bitlines, buffer wordlines, or both. Blocks may be configured to iteratively be moved around a tile 16 to execute I/O operations to necessary cells 18 of the tile 16. Using the determined block, counter module 32 may determine a final count for executing the plurality of I/O operations (72). The final count may be determined by dividing a number of I/O operations to be executed within tile 16 with a number of I/O operations that will be executed in every block. Counter module 32 may set the count to one (74).

Write module 24 may execute a subset of I/O operations in parallel within tile 16 using a block (76). Write module 24 may determine whether or not the current count is greater than the final count (78). In some examples, the count may initially be set to zero, and write module 24 may instead determine whether the current count is equal to the final count. Write module 24 may use counter module 32 to determine that the current count is not greater than the final count ("NO" path of 78). In response to the current count not being greater than the final count, counter module 32 may add one to the current count (82). Write module 24 may change the block address to a location that includes unexecuted cells 18 (84). Write module 24 may then again execute another subset of I/O operations in parallel to the block.

Write module 24 may determine whether the current count is now greater than the final count (78). Write module 24 may use counter module 32 to determine that the current count is now greater than the final count ("YES" path of 78). Upon determining that the current count is now greater than the final count, NVM device 10 may determine that plurality of I/O operations is complete (80).

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A storage device comprising:
   a cross-point non-volatile memory (NVM) device that includes a first subset of cells, wherein cells of the first subset of cells share a bitline or a wordline, wherein for each adjacent pair of cells from the first subset of cells, there is at least one respective buffer cell that is between the respective cells of the adjacent pair of cells; and
   a control module, the control module configured to:
      receive a set of I/O operations; and
      execute a first subset of the set of I/O operations in parallel across the first subset of cells, wherein I/O operations of the first subset of I/O operations are not executed at the respective buffer cells, wherein the at least one respective buffer cell is configured to not be programmed or erased when the first subset of the set of I/O operations are executed.

2. The storage device of claim 1, wherein the control module is further configured to determine that a sufficient power budget exists to execute the first subset of the set of I/O operations in parallel based on voltage drop and current for performing the set of I/O operations on the first subset of cells.

3. The storage device of claim 1, wherein each cell of the first subset of cells share both a respective wordline with at least a respective first cell of the first subset of cells and a respective bitline with at least a respective second cell of the first subset of cells.

4. The storage device of claim 1, wherein the control module is further configured to:
   determine a second subset of the set of I/O operations that can be executed in parallel with the first subset of I/O operations by analyzing chip power, voltage drop, and current requirements of the set of I/O operations; and
   execute the second subset of I/O operations in parallel across a second subset of cells of the cross-point memory component as the first subset of I/O operations is executed in parallel across the first subset of cells, wherein:
      cells of the second subset of cells share a wordline or bitline, and for each adjacent pair of cells from the second subset of cells, there is at least one respective buffer cell that is both not undergoing an I/O operation of the second subset of I/O operations and is between the respective cells of the adjacent pair of cells.

5. The storage device of claim 4, wherein the first subset of cells and the second subset of cells includes the same number of cells.

6. The storage device of claim 1, wherein the control module is further configured to determine a number of tiles of the cross-point NVM device by analyzing chip power of the cross-point NVM device, wherein the cross-point NVM device is configured to execute a subset of I/O operations at a subset of cells at each tile of the number of tiles in parallel, wherein the subset of cells includes the same number of cells as the first subset of cells.

7. The storage device of claim 1, wherein the control module is further configured to:
   determine that an amount of I/O operations within the set of I/O operations satisfies a threshold;
   determine that the first subset of the set of I/O operations can be executed in parallel in response to the amount of I/O operations satisfying the threshold; and
   wherein executing the first subset of I/O operations in parallel across the first subset of cells is in response to the amount of I/O operations satisfying the threshold.

8. The storage device of claim 1, wherein the set of I/O operations comprises a first set of write operations, wherein the control module is further configured to:
   receive a second set of I/O operations for the cross-point NVM device;
   determine a threshold write current value based on voltage drop of the cross-point NVM device;
   determine a number of cells in a second subset of cells based on the threshold write current; and
   execute a subset of the second set of I/O operations across the second subset of cells, wherein cells of the second subset of cells share a bitline or a wordline, wherein for each adjacent pair of cells from the second subset of cells, there is at least one respective buffer cell that is both not undergoing an I/O operation of the second subset of I/O operations and is between the respective cells of the adjacent pair of cells.

9. The storage device of claim 1, wherein the set of I/O operations relate to a set of cells that are physically clustered in a proximate location on the cross-point memory component, and the set of cells include the first subset of cells.

10. The storage device of claim 1, wherein the NVM device includes the control module.

11. The storage device of claim 1, wherein the storage device further comprises a controller, wherein the controller includes the control module.

12. A method of managing read or write operations to a cross-point non-volatile memory (NVM) device, the method comprising:
   receiving a set of read or write operations for the cross-point NVM device, wherein the cross-point NVM device includes a plurality of cells grouped into a plurality of sets of cells, and wherein, for each set of cells, cells of the respective set of cells share a bitline or a wordline of the cross-point NVM device; and
   executing a subset of the set of read or write operations in parallel across a set of cells of the plurality of sets of cells, wherein for adjacent pairs of cells from the set of cells there is at least one respective buffer cell that is both not undergoing a read or write operation of the subset of read or write operations and is between the respective cells of the adjacent pair of cells.

13. The method of claim 12, the method further comprising determining that a sufficient power budget exists to execute a first subset of the set of read or write operations in parallel based on voltage drop and current for performing the set of I/O operations on a first subset of cells.

14. The method of claim 13, the method further comprising:
   determining a second subset of the set of read or write operations that can be executed in parallel with the first subset of read or write operations by analyzing chip power, voltage drop, and current requirements of the set of read or write operations; and
   executing the second subset of read or write operations in parallel across a second subset of cells of the cross-point memory component as the first subset of read or write operations is executed in parallel across the first subset of cells, wherein:
      cells of the second subset of cells share a wordline or bitline, and
      for each adjacent pair of cells from the second subset of cells, there is at least one respective buffer cell that is both not undergoing a read or write operation of the second subset of read or write operations and is between the respective cells of the adjacent pair of cells.

15. The method of claim 14, wherein the first subset of cells and the second subset of cells includes the same number of cells.

16. The method of claim 12, wherein the set of read or write operations relate to cells that are physically clustered in a proximate location on the cross-point memory component, and the cells include the set of cells.

17. The method of claim 12, the method further comprising:
   determining that an amount of read or write operations within the set of read or write operations satisfies a threshold;
   determining that the subset of the set of read or write operations can be executed in parallel in response to the amount of read or write operations satisfying the threshold; and
   wherein executing the subset of read or write operations in parallel across the set of cells is in response to the amount of read or write operations satisfying the threshold.

18. The method of claim 12, wherein the set of read or write operations comprise a first set of write operations, the method further comprising:
   receiving a second set of read or write operations for the cross-point NVM device;
   determining a threshold write current value based on voltage drop of the cross-point NVM device;
   determining a number of cells in a second subset of cells based on the threshold write current; and
   executing a subset of the second set of read or write operations across the second subset of cells, wherein cells of the second subset of cells share a bitline or a wordline, wherein for each adjacent pair of cells from the second subset of cells, there is at least one respective buffer cell that is both not undergoing a read or write operation of the second subset of read or write operations and is between the respective cells of the adjacent pair of cells.

19. A system comprising:
   means for receiving a set of I/O operations for a cross-point non-volatile memory (NVM) device; and
   means for executing a first subset of the set of I/O operations in parallel across a first subset of cells of the cross-point NVM device, wherein cells of the first subset of cells share a bitline or a wordline, wherein for each adjacent pair of cells from the first subset of cells, there is at least one respective buffer cell that is both not undergoing an I/O operation of the first subset of I/O operations and is between the respective cells of the adjacent pair of cells.

20. The system of claim 19, further comprising means for determining that a sufficient power budget exists to execute the first subset of the set of I/O operations in parallel based on voltage drop and current for performing the set of I/O operations on the first subset of cells.

* * * * *